United States Patent
DeMarco

(12)
(10) Patent No.: US 6,463,269 B2
(45) Date of Patent: *Oct. 8, 2002

(54) POWER AMPLIFICATION SYSTEM WITH INTELLIGENT CONTROL OF AMPLIFIER MODULES

(75) Inventor: Anthony Thomas DeMarco, Duluth, GA (US)

(73) Assignee: BellSouth Corporation

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 4 days.

(21) Appl. No.: 08/831,460

(22) Filed: Mar. 31, 1997

(65) Prior Publication Data

US 2001/0051513 A1 Dec. 13, 2001

(51) Int. Cl.[7] .................................................. H03F 3/68
(52) U.S. Cl. .................... 455/341; 455/127; 330/124 D
(58) Field of Search ................................ 455/341, 127, 455/9; 330/124 D, 129, 2, 295

(56) References Cited

U.S. PATENT DOCUMENTS

| | | | | |
|---|---|---|---|---|
| 4,039,947 A | * | 8/1977 | Miedema ......................... | 455/8 |
| 4,755,769 A | * | 7/1988 | Katz ............................ | 330/295 |
| 5,144,258 A | * | 9/1992 | Nakanishi et al. ............ | 330/129 |
| 5,192,919 A | * | 3/1993 | Wieczorek ................... | 330/129 |
| 5,200,955 A | * | 4/1993 | McFarlane et al. ......... | 370/315 |
| 5,256,987 A | * | 10/1993 | Kibayashi et al. ........... | 330/295 |
| 5,543,751 A | * | 8/1996 | Stedman et al. ......... | 330/124 D |
| 5,561,395 A | * | 10/1996 | Melton et al. .................. | 330/2 |
| 5,831,479 A | * | 11/1998 | Leffel et al. ............. | 330/124 D |
| 5,834,975 A | * | 11/1998 | Bartlett et al. ............... | 330/278 |
| 5,974,041 A | * | 10/1999 | Kornfeld et al. ............. | 370/342 |
| 5,986,500 A | * | 11/1999 | Park et al. ............... | 330/124 D |

FOREIGN PATENT DOCUMENTS

WO 97/24800 * 7/1997 ............. H03F/3/60

* cited by examiner

Primary Examiner—Daniel Hunter
Assistant Examiner—Alan T. Gantt
(74) Attorney, Agent, or Firm—Kilpatrick Stockton LLP

(57) ABSTRACT

A product and system is disclosed for intelligently controlling the number of amplifier modules that are active in a linear amplification system. By exercising such control, the system can avoid using unnecessary power. The invention monitors the system and gathers information from signals associated with the system, particularly information concerning signal power. A control functionality evaluates the gathered information to decide how many modules are necessary to sufficiently operate the amplification system or to decide if it has been commanded to perform certain functions. Once this decision is made, the control functionality communicates control signals to the power amplification modules to activate the needed or desired number of modules and deactivate the unneeded or undesired number of modules. Likewise, the control functionality configures the splitter and the combiner according to the number of needed or desired amplifier modules. This gathering, evaluation, and control is conducted continuously.

24 Claims, 6 Drawing Sheets

POWER AMPLIFICATION SYSTEM WITH INTELLIGENT CONTROL OF AMPLIFIER MODULES

FIELD OF THE INVENTION

The present invention relates in general to the field of wireless telecommunications and in particular to the field of power conservation in the amplification of communication signals.

BACKGROUND OF THE INVENTION

Systems comprising multiple linear power amplifiers have many applications. For example, multiple-channel, four-module linear amplifier systems are used in cellular-telephone base stations or "cell sites". Such base stations, or cell sites, are well known and are described, for instance, in George Calhoun, *Wireless Access and the Local Telephone Network* 128–135 (1992), which is incorporated herein by reference. Such amplifier systems are used within cell sites to amplify multiple radio-frequency (RF) signals of various and differing frequencies, or channels or carriers. Such a system typically comprises a splitter, a plurality of linear amplifier modules, a combiner, a splitter/combiner control functionality, and a monitor and control module. Examples of such a system include the Spectrian MC160A series of multi-carrier power amplifiers and the PowerWave MCA9000-400 series of linear amplification systems.

In such a system, an "input signal" is fed into a splitter. This input signal comprises one or more radio-frequency signals of differing frequencies. In other words, this input signal may be a multiple-channel signal. These radio-frequency signals may be in any desired format or protocol, including Advanced Mobile Phone Service (AMPS), Time Division Multiple Access (TDMA), or Code Division Multiple Access (CDMA) standards. The splitter splits the input signal into two or more resulting signals. The resulting signals contain the same frequencies as the input signal, but the power, or amplitude, of the input signal is equally divided among the resulting signals. The splitter in a typical four-module linear amplifier system, such as the PowerWave MCA9000-400 Series Four Module Linear Amplification System, features four outputs, each of which are coupled to one of four linear amplifier modules. The splitter is configured according to the number of linear amplifier modules that are coupled to the splitter and operational. A splitter/combiner control functionality, embodied by, for example, a microprocessor or shelf logic, monitors the number of amplifier modules that are coupled to the splitter and operational, and configures the splitter and combiner accordingly. In a four-module system in which all four modules are operational, the splitter/combiner control functionality configures the splitter for four-modules such that the splitter splits an input signal into four resulting signals, each of which comprise the same frequency content as the input signal and are one-quarter the power. When the splitter is configured according to three coupled and operational amplifier modules, the splitter splits the input signal into three resulting signals, each of equal power, one-third of the input signal. Similarly, when the splitter is configured for two modules, the splitter splits the input signal into two signals, and when the splitter is configured for one module, the splitter does not split the signal.

Each of the four modules amplifies the signal input to that S module to a desired level. The amplified signals are coupled to a combiner. The splitter/combiner control functionality configures the combiner according to the number of power modules coupled to the splitter and that are operational. Thus, in a four-module system, the splitter/combiner control functionality logic configures the combiner for operation in such a system. Accordingly, the combiner combines the four amplified signals into a single output signal for transmission. Typically, this combined output is fed through antenna interface circuitry to a transmit antenna.

Also in such a system, a monitoring and control device is employed to provide and control operating power to each of the modules, to monitor each of the modules, to activate or deactivate all of the modules, and to notify the operator if the system is operating outside of parameters. This device may also be used to configure and reconfigure the splitter and combiner, together with or in place of the splitter/combiner control functionality.

In the systems used in conventional cellular-telephone cell sites, the monitoring and control device does not activate or deactivate individual power amplifier modules independently. All of the modules are either active or all of the modules are inactive.

The multiple-channel, multiple-amplifier linear amplifier systems employed in conventional cell-sites require considerable power and are consequently expensive to operate. A power supply at a conventional cell-site typically provides power to the system at 24–27 DC Volts and the current needed by the system at the time. The power needed by the system typically varies over time each day according to subscriber use of the system. During peak hours, when subscriber demand is highest, the system may require 1500–2500 Watts. During off-peak hours, the power requirement of the system may be approximately 150 Watts, drastically less than the peak-hours demand.

A large part of the power required to operate a four-module linear amplifier system can be thought of in some respects as overhead—it simply maintains all four of the power amplifier modules in an active state when the system is in operation. During peak hours, all four power amplifiers are often needed to amplify the signals handled by the system. Thus, it is often necessary to maintain all four power-amplifiers in the active state during peak hours. During off-peak hours, however, the system may need only one or two of the power amplifiers modules for sufficient operation. It may thus be that only one or perhaps two of the amplifier modules are required to be active during off-peak hours. Maintaining only the required amplifier modules in the active state would require considerably less overhead power.

As mentioned above, the conventional systems do not provide for control over the activation or deactivation of individual power amplifier modules. Rather, all modules remain in the same operation state at any particular time. For example, in a conventional four-module system, all four modules remain in the active state during both peak and non-peak hours. Thus, because all of the modules are either active or inactive at all times, the power amplifier modules: use more power than is necessary for sufficient operation of the system. Conventional systems accordingly use power inefficiently and are therefore more expensive to operate than necessary.

SUMMARY OF THE INVENTION

Linear power amplifier systems accordingly to the present invention include an input line, a splitter, a plurality of linear power amplifier modules, a combiner, and a control functionality. The control functionality configures the splitter and combiner according to the number of active amplifier modules coupled to the splitter. The input line delivers a number of input signals on a number of channels to the splitter, which splits the signals among a number of splitter outputs according to its configuration. Each splitter output is coupled to a linear power amplifier module. The signals allocated to each splitter output are communicated by this connection to the corresponding amplifier module. Each linear amplifier module amplifies the communicated signals, and the output of each module is provided to a combiner. The combiner combines the amplified signals according to its configuration and outputs the combined signal, eventually to a radiator. The control functionality, which may be implemented in a microprocessor, receives signals from the system, evaluates them, and uses them to control the linear power amplifier modules. The control functionality evaluates, among other things, how many linear amplifier modules should be in the active state and how many should be in the inactive state at any particular point in time. This decision may be based upon how many amplifier modules are necessary to carry out the system's objectives. The control functionality will examine the signals it receives from the system to determine, among other things, the volume of signals the system is currently handling. The control functionality may determine the volume of signals the system is currently handling by evaluating the power level of the signals. The control functionality is programmed to determine how many amplifier modules are needed by the system to amplify the detected volume of signals. In addition, this decision may be based, in part or in whole, upon human intervention, upstream information, and other factors supplied by a common-control module.

Linear power amplifier systems according to the present invention use power more efficiently than conventional systems. Such efficiency allows the operating cost of linear power amplification systems according to the present invention to be lower than the operating cost of conventional systems.

Structural differences between systems according to the present invention and conventional systems include the communications lines facilitating independent control over individual power amplification modules. Structural differences also include the combination of structure embodying a splitter, a combiner, and individually-controlled power amplification modules in a mobile communications cell site.

Systems according to the present invention employ the intelligent control of linear amplifier modules in order to increase power-use efficiency. This intelligent control is made after evaluation of states at one or points within and, if desired, without the system. These states may be a wide variety of types of signals, including CDMA, TDMA, and AMPS. Systems according to the present invention are able to evaluate these one or more types of signals and intelligently control individual amplifier modules according to that evaluation. These systems employ structures which split and combine RF signals.

It is accordingly an object of the present invention to provide a linear power amplifier system that uses power more efficiently than the conventional systems by, among other things, controlling activation/deactivation of individual power amplifiers in a manner that reflects actual required capacity.

It is another object of the present invention to provide a linear power system that intelligently controls multiple power amplifier modules of the system so that individual modules can be placed in the active or inactive state as desired, independent of the state of other modules.

It is a further object of the present invention to provide a mobile communications linear power amplifier that requires less power to operate than conventional mobile communications power amplifiers.

Other objects, features, and advantages of the present invention will be apparent with respect to the remainder of this document.

DETAILED DESCRIPTION OF THE PREFERRED EMBODIMENT

Figure 1:
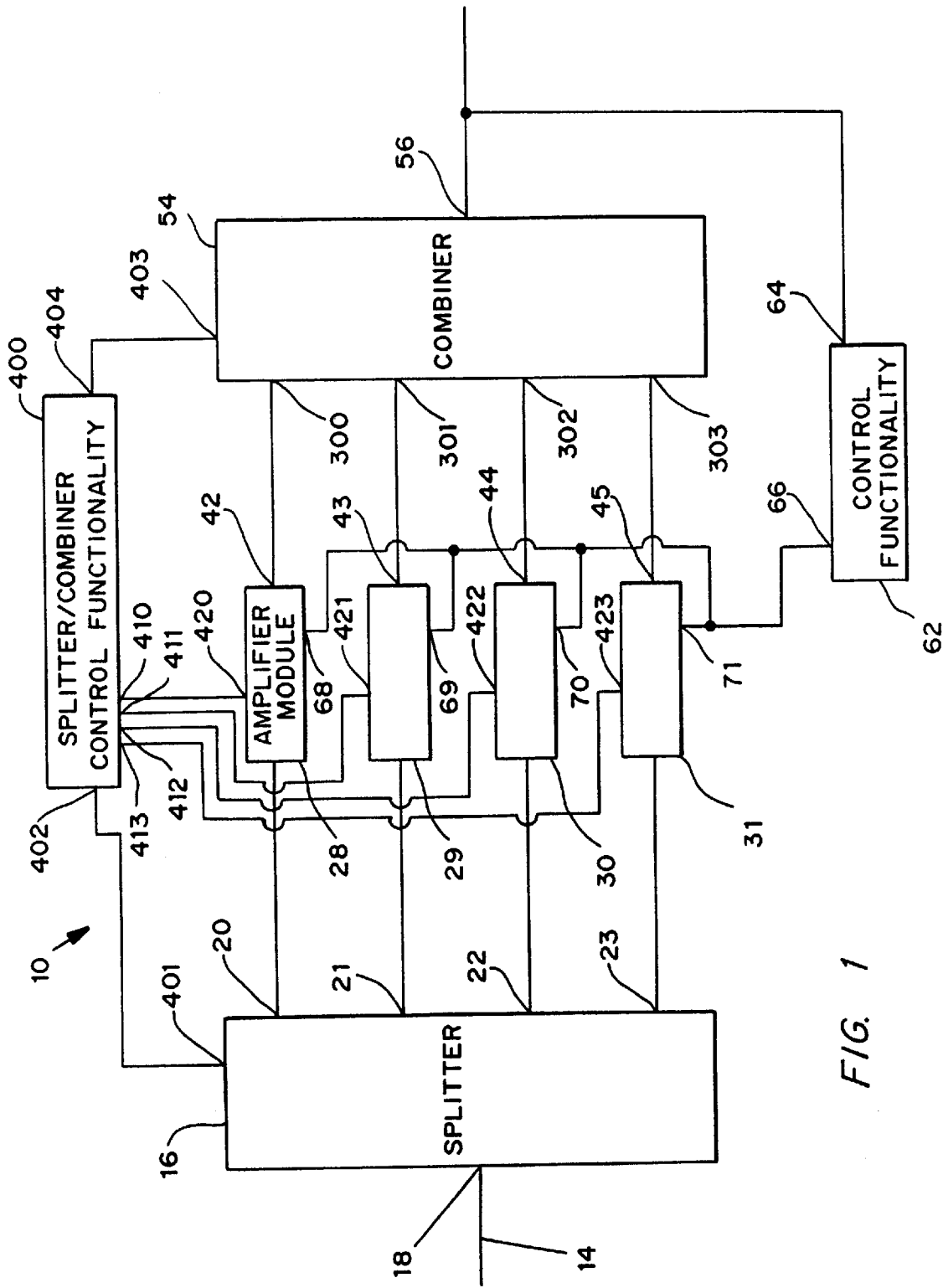
FIG. 1 schematically shows an embodiment of linear power amplifier systems of the present invention with four power-amplifier modules, a control functionality monitoring the system output, a single communications line between the control functionality and the modules, and a splitter/combiner control functionality monitoring the modules and accordingly configuring the splitter and the combiner.

The present invention provides intelligent control of multiple linear power amplifier modules. The control functionality, which may be implemented in a microprocessor, logic circuitry, or in distributed processing, using artificially intelligent or rules-based implementations, neural net, or any other desired mode or control process, monitors the system and other factors if desired, and provides control to the amplification capacity of the system based on its monitoring and evaluation. By activating only the amplifier capacity necessary for sufficient operation of the system, this intelligent control functionality provides a linear power amplifier system that uses power in a more efficient manner than conventional systems.

According to the preferred embodiment, a multiple-channel, four-module linear amplifier system is of the sort used in cellular-telephone cell sites. The present invention, however, can be embodied in various other systems, including PCS sites, other mobile radio sites, systems with more or less than four modules, and systems used at locations other than mobile radio sites.

In a preferred embodiment, the control functionality is coupled to one or more circuits or components ("points") within and, if desired, without the system, in order to monitor various states inside (and, if desired, outside) the system, such as input or output at various points in the system. The control functionality evaluates the state at such point(s) in order to determine how many of the power amplification modules are needed to meet the demand on the system at that time. Point(s) to which the control functionality may be coupled include points in system input, system output, output of a common control module, points external to the system, or a combination thereof. States which may be monitored in the system preferably include signal power at those points. After determining how many modules are necessary for sufficient operation of the system, the control functionality activates the particular modules needed at that particular time and deactivates the modules not needed at that time. As in conventional systems, a control functionality, such as implemented in a microprocessor or other logic circuits, monitors the modules. The control functionality configures the splitter and the combiner according to the number of modules that are present and operational.

The control algorithm for the splitter and combiner carried out by the control functionality or the splitter/combiner control functionality according to the present invention needs to be such that dynamic reconfiguration of the splitter and combiner, and dynamic activation and deactivation of amplifier modules, are controlled to maintain gain in the system. Particularly if the splitter and dynamic activation and deactivation of amplifier modules are not carefully controlled, the modules may become overloaded and damaged.

Some conventional splitters and combiners have control inputs that may be used in accordance with the present invention to dynamically reconfigure the splitter and combiner according to the number of amplifier modules in the active state. Other splitters and combiners will require a new control interface, one that is capable of coupling to a control functionality or a splitter/combiner control functionality according to the present invention.

The design, construction, and operation of systems according to the present invention is flexible depending upon the needs of the application to which the invention is directed. The number and location of points within the system to which the control functionality is coupled may be varied. The control functionality is responsive to certain states or ranges of states at the points to which the control functionality is coupled. Human intervention, external control intervention, or other external input can be employed to override or modify the manner in which the modules are activated regardless of states in the system that reflect certain capacity requirements. The control functionality, whether or not distributed, can also be implemented to evaluate and adjust the operation-state of the modules at preselected time intervals, at random time intervals, or, preferably, continuously.

FIG. 1 shows a four-module linear amplifier system 10 embodying the present invention according to the best mode. The system 10 includes a splitter 16, four power amplifier modules 28, 29, 30, 31, a combiner 54, and a control functionality 62. When the system is in operation, one or more radio-frequency signals (not shown) in a format such as AMPS, TDMA, or CDMA are provided on an input line 14 to the splitter input 18 into the splitter 16. The splitter 16 allocates the signals among multiple splitter outputs 20, 21, 22, 23 according to the volume of inputted signals, the signals' degradation, which amplifier modules are in the active state, and other factors.

The splitter in the system shown in FIG. 1 has four outputs 20, 21, 22, 23. These outputs 20, 21, 22, 23 are coupled to four linear amplifier modules 28, 29, 30, 31.

Each linear amplifier module has at least two operation states, the active, or amplifying or "on", state and the inactive, or open or "off", state. An amplifier module that is in the active state amplifies the inputted signal at a preselected gain. Preferably, an amplifier module that is in the inactive state essentially acts as an open circuit and does not communicate a signal.

Each module has a control port. The operation state of a module depends upon the signal received by that module's control port 68, 69, 70, 71. If a signal preselected to cause a module to be in the active state is provided to the module's control port, the module will change to the active state if it is in the inactive state, and will remain in the active state if it is already in the active state. If a signal preselected to cause a module to be in the inactive state is provided to the module's control port, the module will change to the inactive state if it is in the active state, and will remain in the inactive state if it is already in the inactive state. The system and modules can be designed and programmed to react in a desired manner to a wide variety of signals.

Each module that is in the active state amplifies the signal inputted into that module and provides an amplified signal at its output. The modules' outputs are shown in FIG. 1 as 42, 43, 44, and 45. The outputs 42, 43, 44, 45 are coupled to the combiner inputs 300, 301, 302, 303. The amplified signals are fed from the outputs into a combiner 54. The combiner 54 combines the inputted signals and provides an output signal at the combiner output 56. The combiner output 56 is the system output in the embodiment shown. The combiner output 56 may be coupled to antenna circuitry (not shown), which prepares the signal for antenna transmission.

The control functionality is preferably preprogrammed. The control functionality may monitor a state such as the combiner's output signal, including particularly the power level of the output signal, to determine how many active amplifier modules are needed for the system to operate sufficiently. In that case, the combiner output 56 is coupled to the input 64 of the control functionality 62. The control functionality evaluates the signal on its input 64 and communicates a control signal on its control output 66 to the amplifier modules 28, 29, 30, 31. The control signal communicated by the control functionality 62 depends upon the signal seen by the control functionality 62 at its input. The control functionality 62 may be preprogrammed to evaluate the signal(s) on its input 64 in order to determine how many of the four power amplifier modules 28, 29, 30, 31 should be in the active state to operate the linear power amplifier system 10 sufficiently. For example, the control functionality may be programmed to determine that if a given level of signal power is present at the system output, the system is probably handling a certain number of calls, and only two of the power modules are necessary to amplify signals for that number of calls.

If the control functionality 62, upon evaluating the signal on its input 64, determines that only two of the four amplifier modules 28, 29, 30, 31 are needed in the active state to operate the linear power amplifier system 10 sufficiently, then the control functionality 62 communicates a preselected signal to the amplifier modules's control-ports 68, 69, 70, 71 that causes two modules 28, 29 to be in the active state and two modules 30, 31 to be in the inactive state. This signal may be comprised of analog or digital signals as selected during design. Preferably, the signal is a digital signal. If the control functionality 62 determines that only one amplifier module is needed in the active state, the control functionality communicates a different preselected signal to the modules that causes one module to be in the active state and three modules in the inactive state. Similarly, if the control functionality determines that three amplifier modules are needed in the active state, the control functionality communicates an appropriate, predetermined signal to the modules; and if the control functionality determines that four modules are needed in the active state, the control functionality communicates an appropriate, predetermined signal to the module.

The splitter/combiner control functionality 400 is coupled to the amplifier modules 28, 29, 30, 31. Each amplifier module 28, 29, 30, 31 has an amplifier-module state output 420, 421, 422, 423, which reflects the operation state of the corresponding module. The functionality 400 is also coupled to the splitter 16 and the combiner 54. The functionality's coupling to the amplifier modules 28, 29, 30, 31 allows the functionality 400 to monitor the modules' operation-state and determine how many and which of the amplifier modules are in the active state. The functionality uses this information to configure the splitter 16 and combiner 54 accordingly. Thus, if the control functionality 62 determines that only two amplifier modules are necessary for sufficient operation of the system, and activates two amplifier modules and deactivates two modules, the splitter/combiner control functionality 400 will recognize that only two modules are in the active state, and configure the splitter and the combiner accordingly. Thus, if only two amplifier modules 28, 29, are in the active state, the splitter/combiner control functionality 400 will configure the splitter such that the splitter splits the input signal into two signals that are communicated to only two splitter outputs 20, 21. Likewise, the functionality 400 will configure the combiner such that the combiner combines signals on only two of its combiner inputs 300, 301. The system according to FIG. 1 is an improvement over the contentional systems because it provides dynamic independent control over individual amplifier modules as desired.

Figure 2:
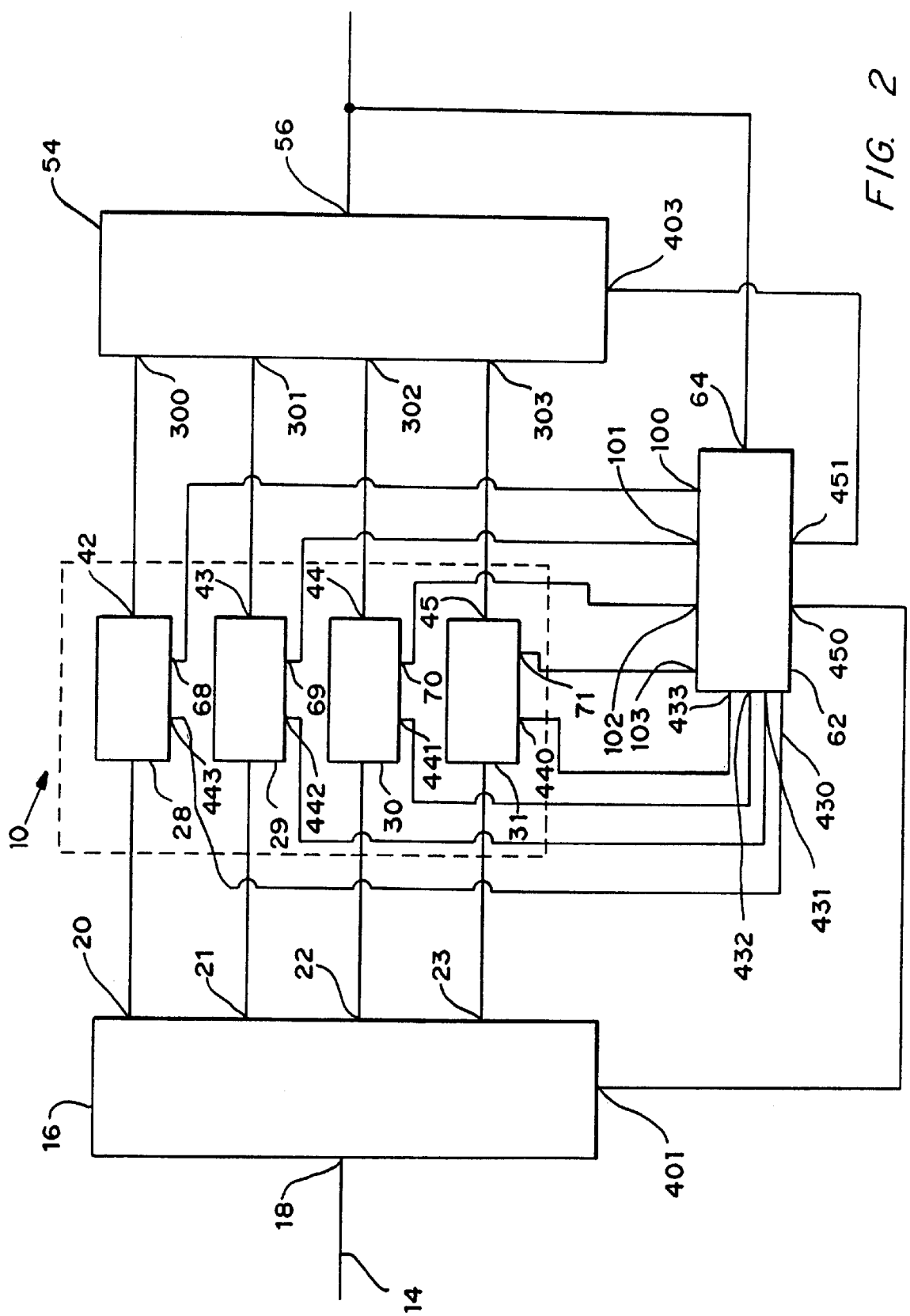
FIG. 2 schematically shows a second embodiment of systems of the present invention with four power-amplifier modules, a control functionality monitoring the system output and the modules, as well as configuring the splitter and combiner, and multiple communications lines between the microprocessor and the modules.

FIG. 2 shows another embodiment of the present invention. The system of FIG. 2 operates in essentially the same manner as the system of FIG. 1, described above. The control functionality of the system shown in FIG. 2, however, is constructed, and operates, differently than the control functionality described above. The control functionality shown in FIG. 2 has four control outputs 100, 101, 102, 103, and each control output is coupled to one, and only one, amplifier-control port, 68, 69, 70, 71. Also, the function of the splitter/combiner control functionality 400 in FIG. 1 is carried out by the control functionality 62 of FIG. 2.

If the control functionality 62, upon evaluating the signal on its input 64, determines that only two of the four amplifier modules 28, 29, 30, 31 are needed in the active state to sufficiently operate the linear power amplifier system 10, then the control functionality 62 provides a digital 1 on two of its control outputs 100, 101, and a digital 0 on the other two 102, 103. Accordingly, a digital 1 is communicated to two amplifier-control ports 68, 69, and a digital 0 is communicated to the other two amplifier-control ports 70, 71.

Each amplifier module is programmed to be in the active state when a digital 1 is on its amplifier-control port and to be in the inactive state when a digital 0 is on its amplifier-control port. Thus, when the control functionality 62 communicates two digital 1s and two digital 0s, two of the modules 28, 29 are in the active state and two of the modules 30, 31 are in the inactive state.

If the control functionality 62 determines that only one amplifier module is needed in the active state, the control functionality communicates one digital 1 and three digital 0s, and thus one of the modules 28 is in the active state, and the other three modules 29, 30, 31 are in the inactive state. similarly, if the control functionality determines that three amplifier modules are needed in the active state, the control functionality communicates three digital 1s and one digital 0, and thus three of the modules 28, 29, 30 are in the active state, and the other module 31 is in the inactive state. If the control functionality determines that four modules are needed in the active state, the control functionality communicates four digital 1s and no digital 0s, and accordingly all four modules 28, 29, 30, 31 are in the active state.

In FIG. 2, the control functionality 62 is coupled to the splitter 16 and the combiner 54. Also, the control functionality 62 is coupled to the four amplifier modules 28, 29, 30, 31. While performing the determinations described in the preceding paragraph, if the control functionality 62 determines that three amplifier modules are needed in the active state, the control functionality, in addition to communicating to the amplifier modules, configures the splitter 16 and the combiner 54 for operation with three amplifier modules. In such a configuration, the splitter will split the input signal into three signals at the splitter outputs 20, 21, 22, and the combiner will combine signals on three of the combiner inputs 300, 301, 302. Likewise, if the control functionality 62 determines that only one amplifier module is needed, the functionality 62 configures the splitter 16 and combiner 54 for operation with one amplifier module.

Figure 3:
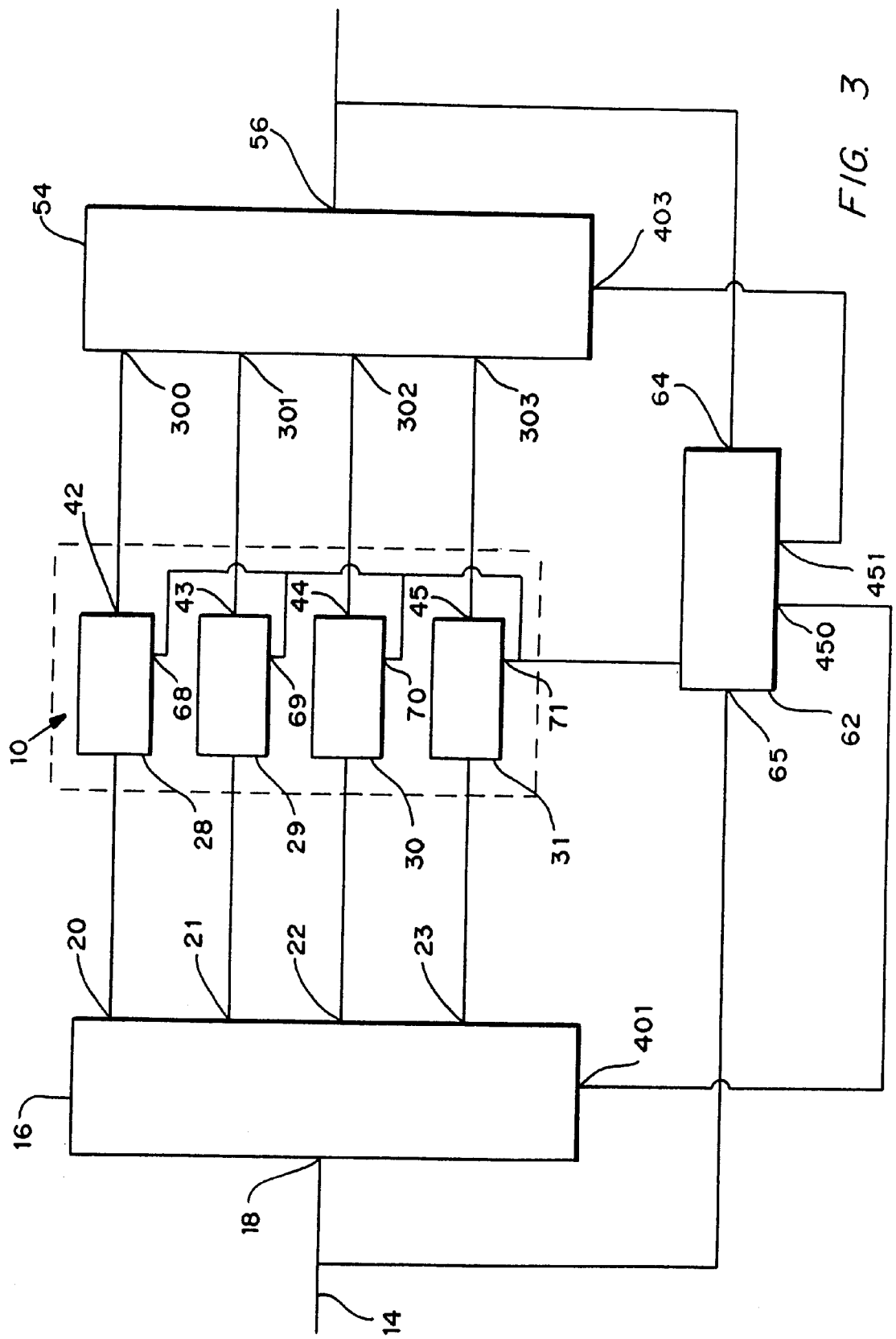
FIG. 3 schematically shows a third embodiment of systems of the present invention with four power-amplifier modules, a control functionality monitoring both the system output and the system input, as well as configuring the splitter and combiner accordingly, and a single communications line between the microprocessor and the modules.

FIG. 3 shows another embodiment of the present invention. The system shown in FIG. 3 operates essentially the same as the system shown in FIG. 1. However, the control functionality 62 shown in FIG. 3 has two control functionality inputs 64, 65. One of the control functionality inputs 64 is coupled to the combiner output 56 just as the single control functionality input is coupled to the combiner output in FIG. 1 and FIG. 2. The second control functionality input 65 of the system shown in FIG. 3 is coupled to the input line 14. Accordingly, the system input signal is communicated not only to the splitter input 18, but is also communicated to one of the control functionality inputs 65. Preferably, the control functionality 62 is preprogrammed with the gain of the system. The control functionality can also be preprogrammed to calculate the system gain from its input (s) and if connected appropriately, preferably as shown in FIG. 3. The control functionality 62. shown in FIG. 3 uses both the system output signal and the system input signal to determine how many amplifier modules should be in the active state and how many should be in the inactive state to provide the amplification necessary for satisfactory system operation. As discussed above, after making such an evaluation, the control functionality sends control signals to the modules to activate the necessary modules and deactivate the unnecessary modules.

Moreover, the configuration of the splitter 16 and the combiner 54 shown in FIG. 3 is controlled by the control functionality 62. In the embodiment shown in FIG. 3, however, the functionality 62 is not coupled to the amplifier modules 28, 29, 30, 31. The modules 28, 29, 30, 31 are not monitored by the functionality 62 in the functionality's determination of how the splitter 16 and combiner 54 should be configured (the functionality 62 may monitor the modules for other reasons, though (not shown)) The control functionality configures the splitter 16 and combiner 54 after determining how many modules should be activated for sufficient operation of the system.

The figures herein show the preferred placement of connections to the control functionality inputs. These connections may be made anywhere within the system, however. For example, the control functionality inputs could be made to the four splitter outputs and all four amplifier outputs of the system shown in FIG. 3. This would provide essentially the same information to the control functionality as connecting the control functionality inputs to the system input line 14 and the combiner output 56 as shown in FIG. 3. The four connections to the splitter output would provide essentially the same information as the connection to the input line 14, and the four connections to the amplifier module outputs would provide essentially the same information as the connection to the combiner output 56.

Figure 4:
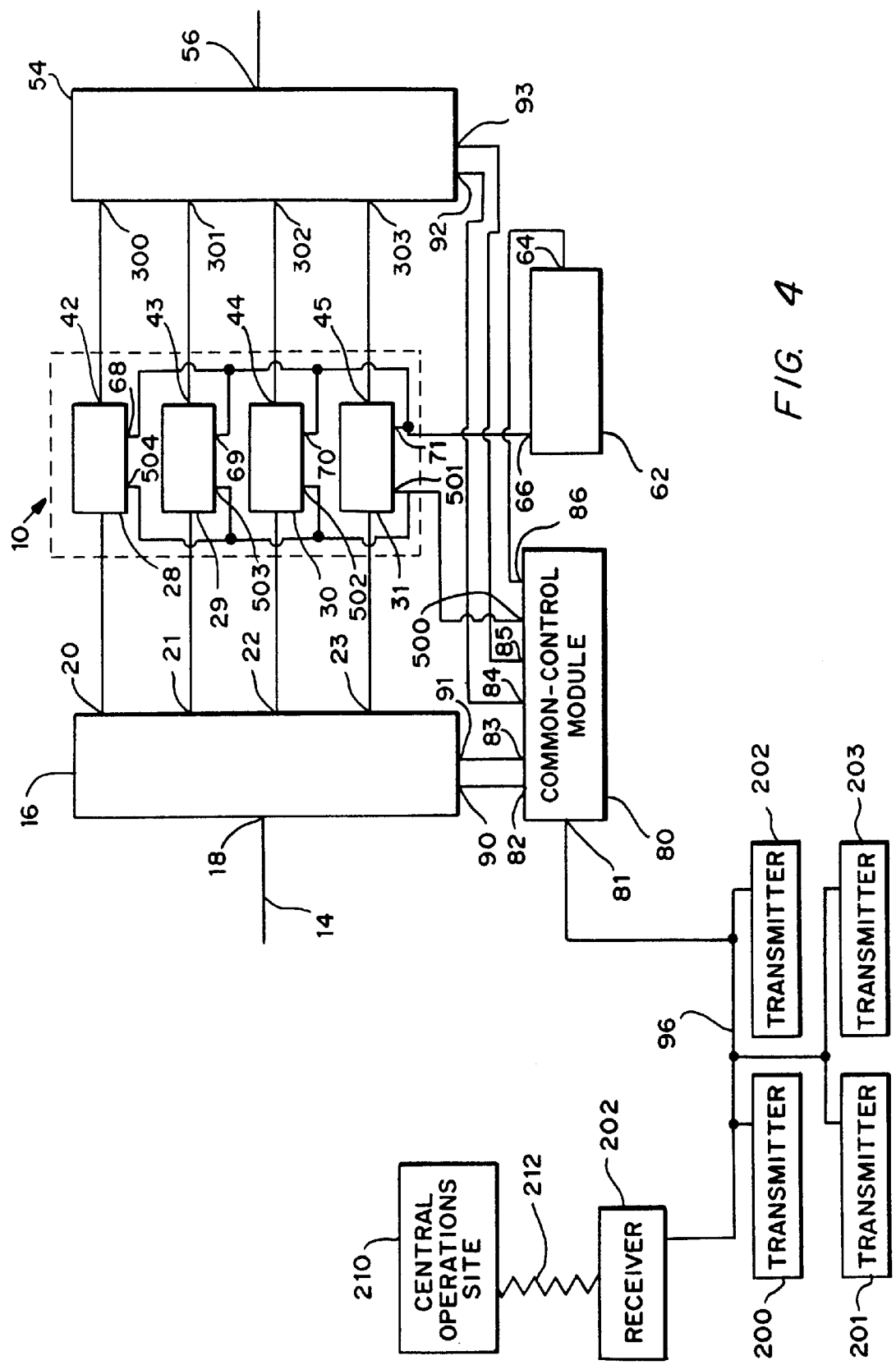
FIG. 4 schematically shows a fourth embodiment of systems of the present invention with four power-amplifier-modules, a control functionality monitoring the output of a common-control module, and a single communications line between the microprocessor and the modules, in which the common-control module is monitoring the communications bus of the site transmitters and is configuring the splitter and combiner.

FIG. 4 shows another embodiment of the present invention. The system shown in FIG. 4 operates essentially the same as the system shown in FIG. 1. However, the system shown in FIG. 4 includes a common-control module 80. The common control module 80 is used to monitor and control individual parts of the system as desired. It can also be used to command the control functionality to function as desired. In FIG. 4, the common-control module 80 includes two common-control inputs 83, 85. One of the inputs 83 is coupled to the splitter monitor-port 91. The splitter monitor-port 91 provides information in the form of one or more signals about the current and/or past operation of the splitter 16. The coupling of the input 83 and the splitter monitor-port 91 allows the common-control module 80 to monitor the operation of the splitter 16. The second input 85 is coupled to the combiner monitor-port 93, which provides information about the current and/or past operation of the combiner 54. The coupling between the combiner monitor-port 93 and the second input 85 allows the common-control module 80 to monitor the operation of the combiner 54. The common-control module may also monitor individual lines, such as the input line 14 (this is not shown).

The common-control module 80 shown in FIG. 4 includes two common-control outputs 82, 84. One output 82 is coupled to a splitter control-port 90. The other output 84 is coupled to a combiner control-port 91. The splitter control-port 90 allows an outside device to control various aspects of the splitter's operation, and the combiner control-port 91 allows an outside device to control various aspects of the combiner's operation.

Modern cell sites may have multiple transmitters 200, 201, 202, 203 that are in communication with a central operations site 210. Central operations sites, or network controllers, are used in cellular communication. The function and structure of central operations sites, or network controllers, and their use in wireless systems are described in George Calhoun, *Wireless Access and the Local Telephone Network* 129–135 (1992), which is incorporated herein by reference. The central operations site 210 monitors various cell sites and manages the cell sites' operation. It may include several transmitters and receivers used in radio-frequency communication, as well as computer hardware used in monitoring and evaluating the operation of cell sites and related information, as well as communicating appropriately with cell sites.

Four transmitters 200, 201, 202, 203 are shown in FIG. 4. These transmitters are located at the cell site along with the system structure described above. The desired frequency of operation and state for the transmitters 200, 201, 202, 203 are communicated to the transmitters by the central operations site 210. For example, the central operations site 210 may communicate that the transmitters should operate at a particular frequency and that only two of the four transmitters should be in operation (or "on"). This is accomplished by the central operations site 210 communicating using radio-frequency signals 212 with a receiver 202 placed at the cell site. The receiver 202 in turn communicates with the transmitters using a communications bus 96. The receiver 202 transmits signals via the communications bus 96 to the transmitters 200, 201, 202, 203 to cause the transmitters to use the desired frequency and/or enter the desired state.

The common-control module 80 includes a common-control input 81. The common-control input 81 is coupled to the communications bus 96. Thus, the signals on the communications bus 96 are communicated to the common-control module 80 as well as the transmitters 200, 201, 202, 203. Accordingly, the common-control module 80 can monitor the communications between the receiver 202 and the transmitters 200, 201, 202, 203. This monitoring allows the common-control to determine how many of the transmitters are in operation and their transmission frequency. This information is evaluated by the common-control module 80. The common-control module 80 transmits a corresponding signal to its common-control output 86, which is coupled to the control functionality input 64. This corresponding signal is used by the control functionality 62 to determine how many amplifier modules should be in the active state and how many should be in the inactive state to provide necessary amplification. As discussed above, after making such an evaluation, the control functionality send control signals to the modules to activate the necessary modules and deactivate the unnecessary modules.

The common-control module 80 shown in FIG. 4 carries out the monitoring and splitter/combiner configuration function of the splitter/combiner control functionality 400 of FIG. 1. The common-control module 80 is coupled to the amplifier modules 28, 29, 30, 31, and thereby monitors which of the modules 28, 29, 30, 31 are active and which are inactive. Like the functionality 400 of FIG. 1, the common-control module 80 configures the combiner 16 and splitter 54 according to the number of amplifier modules in operation. The configuration is communicated to the splitter by the module's 80 coupling to the splitter 82, 90. Likewise, the configuration is communicated to the combiner by the module's 80 coupling to the combiner 84, 91.

The embodiment shown in FIG. 4 can be used with conventional central operations sites. The embodiment would require no further programming of communications system at the central operation site.

Figure 5:
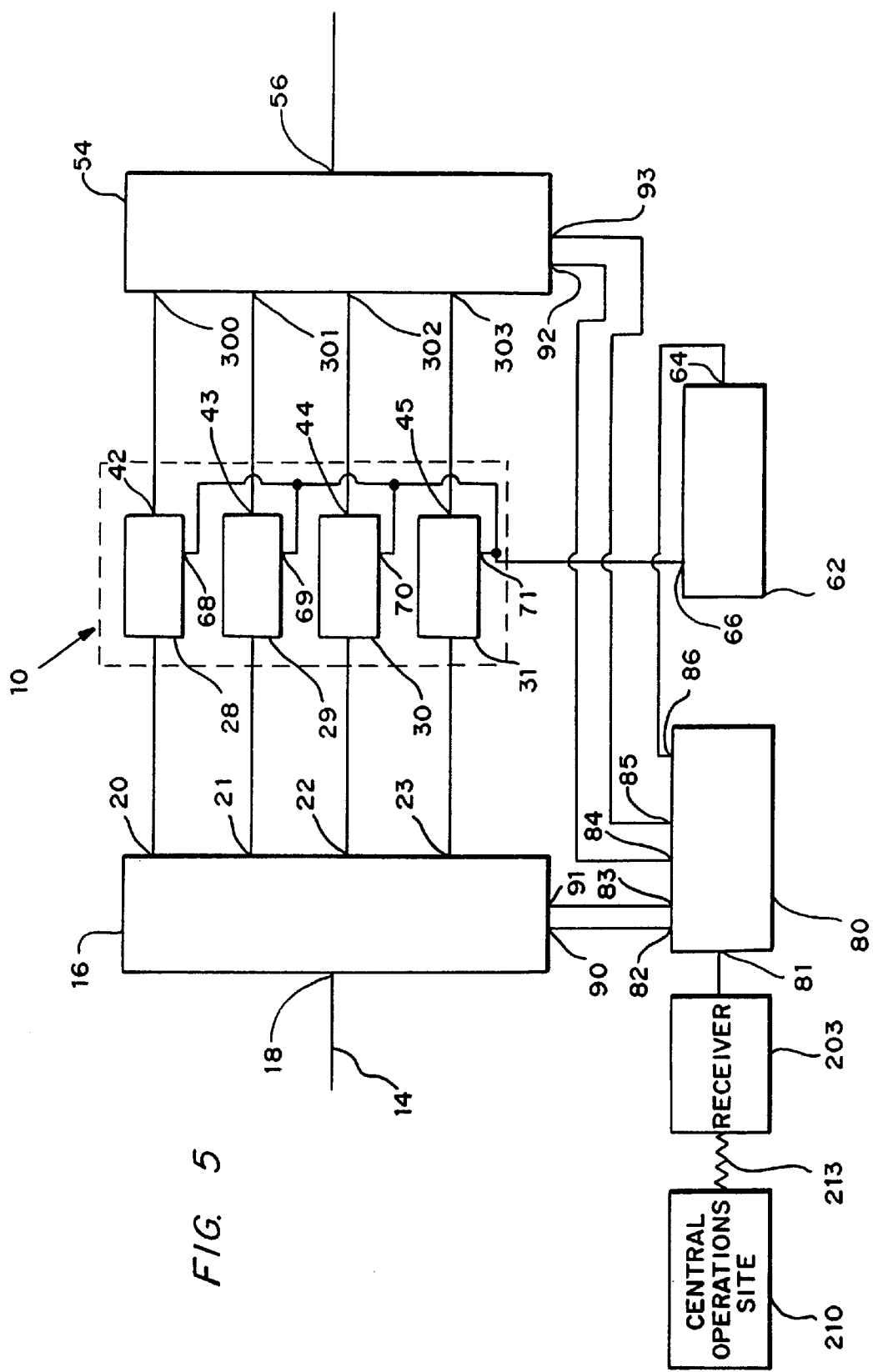
FIG. 5 schematically shows a fifth embodiment of systems of the present invention with four power-amplifier-modules, a microprocessor monitoring the output of a common-control module, and a single communications line between the microprocessor and the modules, in which the common-control module is monitoring the communications directed to the common-control module by the central operations site through a site receiver and is configuring the splitter and the combiner.

FIG. 5 shows another embodiment of the present invention. The system shown in FIG. 5 operates essentially the same as the system shown in FIG. 1 and FIG. 4. However, instead of monitoring the communications bus as the system shown in FIG. 4, the system shown in FIG. 5 is in direct communication with the central operations site 210. The central operations site 210 communicates using radio-frequency signals 213 with a receiver 203 at the cell site. The receiver 203 receives these signals and transmits corresponding signals to the common-control input 81. Thus, the central operations site 210 can send information to the common-control module 80. This information is used by the common-control module, and in turn by the control functionality 62, to determine how many amplifier modules 28, 29, 30, 31 should be in the active state and how many should be in the inactive state. The central operations site 210, common-control module 80, and control functionality 62 are pre-programmed such that the central operations site 210 can direct the operation state of the amplifier modules by communicating with the receiver 203 through radio-frequency signals 213, and in turn with the common-control module 80 and control functionality 62. The common-control module 80 shown in FIG. 5 carries out the monitoring and splitter/combiner configuration function just as the common-control module 80 shown in FIG. 4, described above.

Use of the embodiment shown in FIG. 5 in conventional cellular systems would require some programming at the central operations site. The central operations site would need to be adjusted to communicate with the common-control module.

Although the present invention is discussed herein in context of cellular-telephone cell sites, the present invention can be used in other settings besides: cell sites. For example, it can be used in Special Mobile Radio applications. The present invention can be used in any system that uses multiple channels and conducts amplification using multiple amplifying modules.

Figure 6:
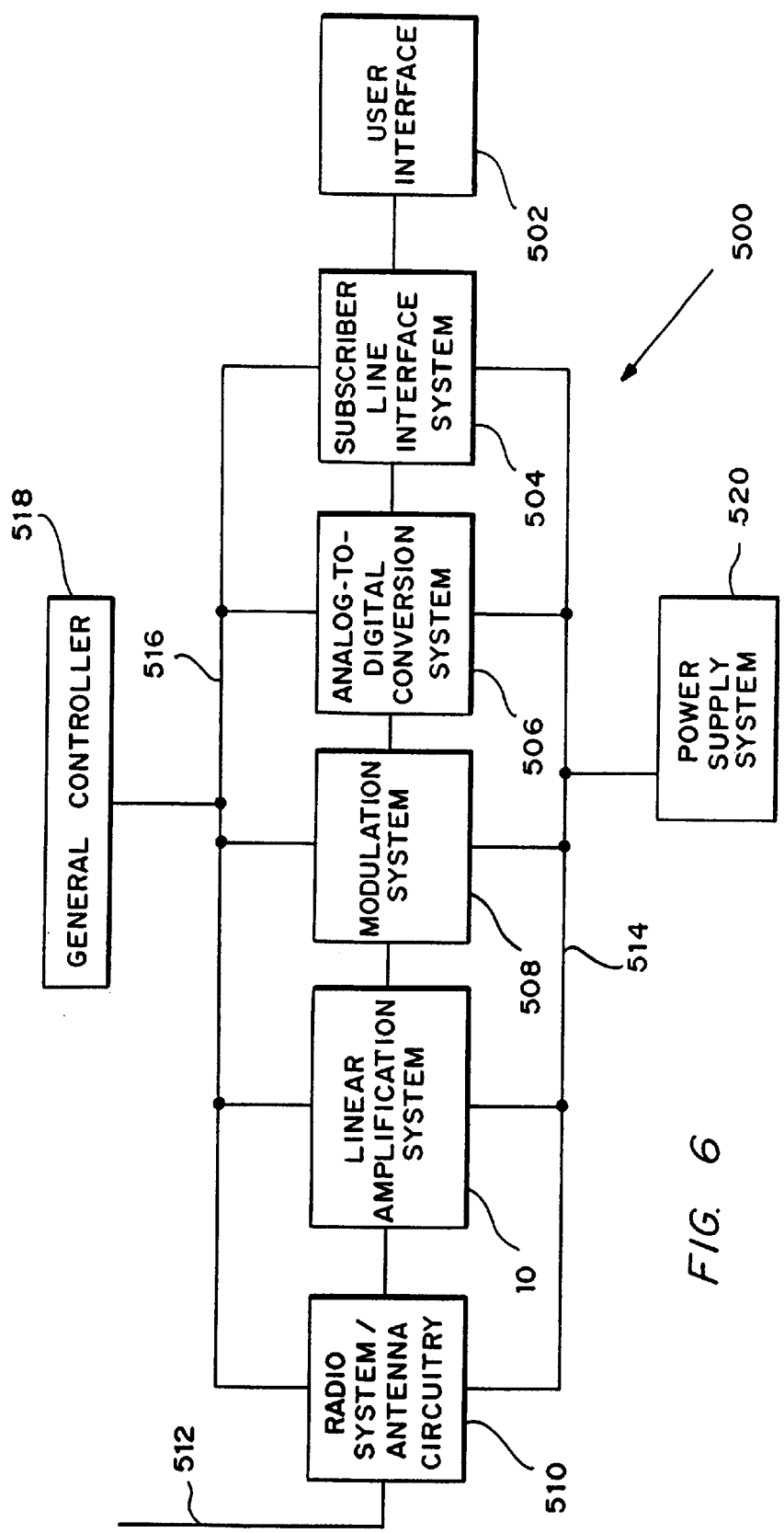
FIG. 6 schematically shows a subscriber station, including a linear amplification system, according to the present invention.

Radio base stations are well known in the art. Such stations and their operation, including their components' operation, are described generally in George Calhoun, *Wireless Access and the Local Telephone Network* 126–135, 241–377 (1992), which is incorporated herein by reference. FIG. 6 schematically shows an embodiment of a subscriber station 500, including a linear amplification system 10, according to the present invention. The subscriber station 500 shown in FIG. 6 includes a user interface 502 to the subscriber station. Such an interface 502 may include an ordinary telephone connection, a wireless connected remote user interface, a subscriber relay station, or a radio-connected telephone or mobile station. The user interface 502 is coupled to a subscriber line interface system, which facilitates communication between the user interface 502 and the subscriber station 500. The line interface system 504 is coupled to an analog-to-digital conversion system 506, which converts the communication from the user interface 502 (analog) to a digital signal. The analog-to-digital conversion system 506 is coupled to a modulation system 508, which modulates the digital signal output of the conversion system 506 in a preselected manner. The modulation system 508 is coupled to a linear amplification system 10 embodying the present invention. The amplification system 10 amplifies the modulated signal according to the present invention. The linear amplification system is coupled to a radio system/antenna circuitry 510. The radio system 510 prepares the amplified signal for transmission using the antenna 512, which is coupled to the radio system 510.

The general controller 518 monitors and controls all of the components of the subscriber station 500. The general controller 518 is coupled to the components by a control circuit 516. The subscriber station 500 is coupled to a power supply system 520, which provides the power required by the station 500 for operation.

The foregoing is provided for purposes of explanation and disclosure of a preferred embodiment of the present invention. Modifications and adaptations to the described embodiment will be apparent to those of ordinary skill in the art and may be made without departing from the scope or spirit of the invention and the following claims.

What is claimed is:

1. A linear power amplifier system comprising:

an input;

a splitter, said splitter including a splitter input and a plurality of splitter outputs;

a plurality of linear power amplifier modules, each amplifier module including an amplifier input and an amplifier output, each amplifier input coupled to at least one splitter output;

a combiner, said combiner including a plurality of combiner inputs and a combiner output, each combiner input coupled to at least one amplifier output;

a control functionality, said control functionality including at least one control functionality input and a plurality of control functionality outputs;

wherein said input is coupled to said splitter input; and wherein a first control-functionality output is coupled to at least one amplifier module, a second control functionality output is coupled to said splitter, and a third control functionality output is coupled to said combiner and wherein said control functionality monitors said at least one control functionality input and in response to detecting a predetermined condition, the control functionality:

controls an operation state of said at least one amplifier module;

controls how many splitter outputs are generated from said splitter input; and controls how many combiner inputs are used to generate said combiner output.

2. The system of claim 1 wherein said at least one control functionality input is coupled to at least one point such that signals at said at least one point are communicated to said at least one control functionality input.

3. The system of claim 1, wherein said at least one control functionality input is coupled to a combiner output.

4. The linear power amplification system of claim 1, further comprising an output line, wherein said output line is coupled to said at least one control functionality input and wherein said output line is coupled to said combiner output.

5. The linear power amplification system of claim 1, wherein said control functionality comprises a microprocessor.

6. The system of claim 1, wherein the number of amplifier modules in the active state is variable.

7. The system of claim 1, wherein said at least one control functionality input is coupled to a point external to the linear power amplification system.

8. The system of claim 1, wherein said input is coupled to said splitter and to said at least one control functionality input.

9. The system of claim 1, wherein said at least one control functionality input is coupled to at least one point external to the linear power amplification system.

10. A method for controlling amplifier modules within a linear power amplification system comprising amplifier modules, said method carried out by a control functionality apparatus, said method comprising the following steps:

evaluating at least one point associated with the linear power amplification system, said system comprising a plurality of amplifier modules, a splitter, and a combiner, wherein said control functionality apparatus is coupled to said amplifier modules, said splitter, and said combiner;

determining which amplifier modules are needed in the active state to maintain sufficient operation of the system, wherein said control functionality is preprogrammed with parameters defining sufficient operation of the system;

activating amplifier modules needed in the active state to maintain sufficient operation of the system;

deactivating amplifier modules not needed in the active state to maintain sufficient operation of the system;

configuring the splitter so that the splitter splits an input signal into a number of signals equal to a number of amplifier modules in the active state; and configuring the combiner so that the combiner combines a number of signals equal to the number of amplifier modules in the active state.

11. The method of claim 10, wherein the evaluating step is performed continuously.

12. The method of claim 11, wherein the number of amplifier modules in the active state is variable.

13. The method of claim 11, wherein the at least one point associated with the linear power amplification system comprises a point which is external to the linear power amplification system.

14. The method of claim 11, wherein the at least one point evaluated comprises a point on a splitter input line, and wherein said splitter input line is coupled to said splitter and to said control functionality apparatus.

15. The method of claim 11, wherein the at least one point evaluated comprises a point on a combiner output line, wherein said combiner output line is coupled to said combiner and to said control functionality apparatus.

16. The method of claim 11, wherein the step of evaluating at least one point associated with the linear power amplification system is performed by a common-control module.

17. The method of claim 11, wherein the at least one point associated with a linear power amplification system comprises a point on a communications bus, which conveys communications between a receiver and at least one transmitter.

18. The method of claim 17, wherein the communications bus couples a receiver to at least one transmitter.

19. A linear power amplifier system comprising:

an input line;

a splitter, said splitter including a splitter input and a plurality of splitter outputs, wherein said input line is coupled to said splitter input;

a plurality of liner power amplifier modules, each amplifier module including an amplifier input and an amplifier output, each amplifier input coupled to at least one splitter output;

a combiner, said combiner including a plurality of combiner inputs and a combiner output, each combiner input coupled to at least one amplifier output;

a first control functionality, said first control functionality including at least one control input and at least one control output, wherein said at least one control output is coupled to at least one amplifier module, and wherein said first control functionality monitors said at least one control input and in response to detecting a predetermined condition, said control functionality controls an operation state of said at least one amplifier module; and a splitter/combiner (SC) control functionality, said SC control functionality including a plurality of SC control inputs and a plurality of SC control outputs, and wherein a first SC control input is coupled to at least one amplifier module, a first SC control output is coupled to said splitter, and a second SC control output is coupled to said combiner, and wherein said SC control functionality monitors said at least one SC control input and in response to detecting a predetermined condition, the SC control functionality:

controls how many splitter outputs are generated from said splitter input; and controls how many combiner inputs are used to generate said combiner output.

20. The system of claim 19, wherein said SC control functionality is coupled to said first control functionality and at least one point external to said system.

21. The system of claim 19, wherein said SC control functionality is coupled to said first control functionality, and a communications bus, wherein said communications bus couples a receiver to at least one transmitter.

22. The system of claim 20, wherein said SC control functionality monitors said communications bus and signals said first control functionality.

23. The system of claim 21, said system further comprising a central operations site, wherein said central operations site communicates with said receiver.

24. The system of claim 23, wherein said central operations site communicates with said receiver via radio-frequency signals.

* * * * *